(12) United States Patent
Smythe et al.

(10) Patent No.: US 7,902,084 B2
(45) Date of Patent: Mar. 8, 2011

(54) SILICON DIOXIDE DEPOSITION METHODS USING AT LEAST OZONE AND TEOS AS DEPOSITION PRECURSORS

(75) Inventors: John Smythe, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 700 days.

(21) Appl. No.: 11/773,622

(22) Filed: Jul. 5, 2007

(65) Prior Publication Data
US 2009/0011607 A1   Jan. 8, 2009

(51) Int. Cl.
*H01L 21/31* (2006.01)
(52) U.S. Cl. ......... 438/761; 438/778; 438/787; 438/788; 438/789; 438/790; 257/E21.24
(58) Field of Classification Search .......... 438/787–790, 438/761; 257/E21.24
See application file for complete search history.

(56) References Cited

U.S. PATENT DOCUMENTS

| | | | |
|---|---|---|---|
| 6,225,236 B1 * | 5/2001 | Nishimoto et al. | 438/778 |
| 7,589,028 B1 * | 9/2009 | Cho et al. | 438/778 |
| 2005/0032394 A1 * | 2/2005 | Iyer | 438/780 |

OTHER PUBLICATIONS

Barron et al., *CVD of SiO₂ and Related Materials: an Overview*, Advanced Materials for Optics an Electronics, vol. 6, pp. 101-114 (1996).

Blech et al., *Effects of humidity on stress in thin silicon dioxide films*, J. Appl. Phys., vol. 53, No. 6, pp. 4202-4207, (Jun. 1982).

Cheng et al., *Thermal desorption spectra of $SiO_2$ films deposited on Si and on thermal $SiO_2$ by tetraethylortho-silicate/$O_3$ atmospheric-pressure chemical . . .* , J. Appl. Phys., vol. 85, No. 10, pp. 7140-7145 (May 15, 1999).

Fitch et al., *Intrinsic stess and stress gradients at the $SiO_2$/Si Interface in structures prepared by thermal oxidation of Si and subjected to rapid thermal annealing*, J. Vac. Sci. Technol. B., vol. 7, No. 4, pp. 775-781 (Jul./Aug. 1989).

Fujino et al., *Dependence of Deposition Rate on Base Materials in TEOS/$O_2$ Ap CVD*, VMIC Conference, pp. 187-193 (Jul. 12-13, 1990).

Gill et al., *Gas phase and surface reactions in subatmospheric chemical vapor deposition of tetraethylorthosilicate- ozone*, J. Vac. Sci. Technol. B., vol. 15, No. 4, pp. 948-954 (Jul./Aug. 1997).

(Continued)

*Primary Examiner* — Angel Roman
(74) *Attorney, Agent, or Firm* — Wells St. John P.S.

(57) ABSTRACT

Embodiments disclosed herein pertain to silicon dioxide deposition methods using at least ozone and tetraethylorthosilicate (TEOS) as deposition precursors. In one embodiment, a silicon dioxide deposition method using at least ozone and TEOS as deposition precursors includes flowing precursors comprising ozone and TEOS to a substrate under subatmospheric pressure conditions effective to deposit silicon dioxide-comprising material having an outer surface onto the substrate. The outer surface is treated effective to one of add hydroxyl to or remove hydroxyl from the outer surface in comparison to any hydroxyl presence on the outer surface prior to said treating. After the treating, precursors comprising ozone and TEOS are flowed to the substrate under subatmospheric pressure conditions effective to deposit silicon dioxide-comprising material onto the treated outer surface of the substrate. Other embodiments are contemplated.

30 Claims, 2 Drawing Sheets

OTHER PUBLICATIONS

Hu et al., *Silicon Nitride Chemical Mechanical Polishing Mechanisms*, J. Electrochem. Soc., vol. 145, No. 11, pp. 3919-3925 (Nov. 1998).

Kobeda et al., $SiO_2$ *film stress distribution during thermal oxidation of Si*, J. Vac. Sci. Technol. B., vol. 6, No. 2, pp. 574-578 (Mar./Ar. 1988).

Matsuura et al., *Film Characteristics of APCVD Oxide Using Organic Silicon and Ozone*, Jpn. J. Appl. Phys., vol. 30, No. 7, pp. 1530-1538 (Jul. 1991).

Matsuura et al., *Novel Self-planarizing CVD Oxide for Interlayer Dielectric Applications*, IEEE, pp. 117-120 (1994).

Morita et al., *Growth of native oxide on a silicon surface*, J. Appl. Phys., vol. 68, No. 3, pp. 1272-1281 (Aug. 1, 1990).

Nakano et al., *a Model of Effects of Surface Pretreatment by Organic Solvents on Ozone-Tetraethoxysilane Chemical Vapor Deposition*, J. Electrochem Soc., vol. 142, No. 2, pp. 641-644 (Feb. 1995).

Nandakumar et al., *Shallow Trench Isolation for Advanced ULSI CMOS Technologies*, IEEE, pp. 133-136 (1998).

Romet et al., *Modeling of Silicon Dioxide Chemical Vapor Deposition From Tetraethoxysilane and Ozone*, J. Electrochem. Soc., vol. 148, No. 2, pp. G82-G90 (2001).

Satake et al., *Detection of Intermediates in Thermal Chemical Vapor Deposition Process Using Tetraethoxysilane*, Jpn. J. Appl. Phys., vol. 33, pp. 3339-3342 (1994).

Tsukamoto et al., *Morphology Evolution of $SiO_2$ Films Deposited by Tetraethylorthosilicate/$O_3$ Atmospheric-Pressure Chemical Vapor Deposition on Thermal $SiO_2$*, Jpn. J. Appl. Phys., vol. 38, pp. L68-L70 (1999).

Xia et al., *High Temperature Subatmospheric Chemical Vapor Deposited Undoped Silicate Glass*, J. Electrochem. Soc., vol. 146, No. 3, pp. 1181-1185 (1999).

* cited by examiner

SILICON DIOXIDE DEPOSITION METHODS USING AT LEAST OZONE AND TEOS AS DEPOSITION PRECURSORS

TECHNICAL FIELD

Embodiments disclosed herein pertain to silicon dioxide deposition methods using at least ozone and tetraethylorthosilicate (TEOS) as deposition precursors.

BACKGROUND

Silicon dioxide is one material commonly used as a dielectric in the fabrication of integrated circuitry. Such can be deposited in a number of different manners. One technique includes thermal chemical vapor deposition using precursor gases comprising ozone and TEOS. Such might be conducted under pressure conditions which are atmospheric, subatmospheric, or greater than atmospheric pressure. Silicon dioxide deposited utilizing TEOS and ozone might deposit at uniform rate and thickness over a substrate, or selectively over different areas of the substrate depending upon underlying different materials over which such are deposited, and which might differ in one or more of composition or density.

DETAILED DESCRIPTION OF EXAMPLE EMBODIMENTS

Figure 1:
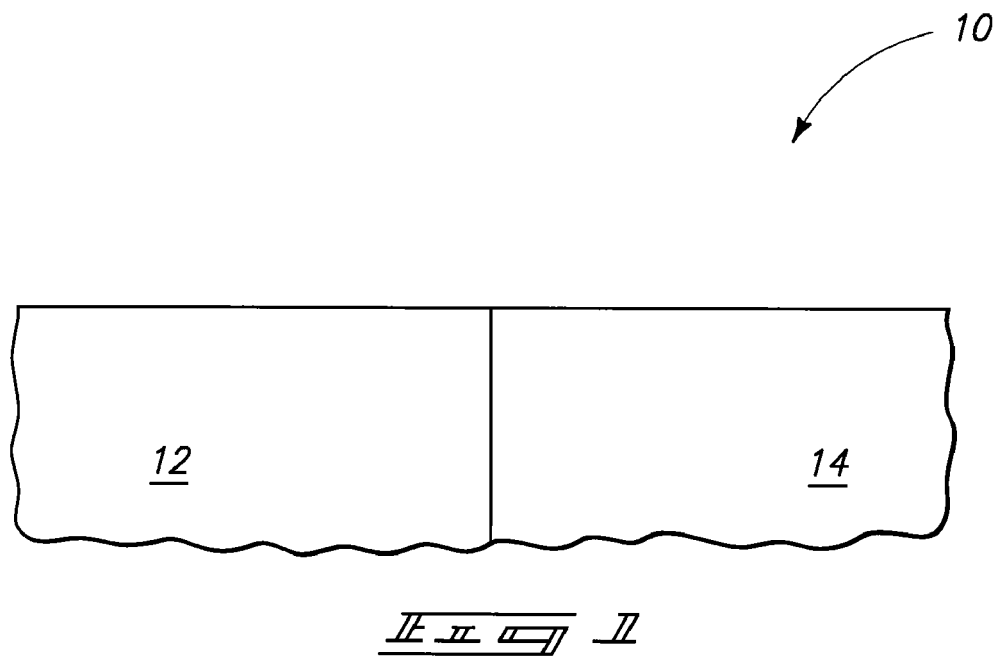
FIG. 1 is a diagrammatic sectional view of a portion of a substrate in process in accordance with an embodiment of the invention.

Embodiments of the invention include silicon dioxide deposition methods using at least ozone and TEOS as deposition precursors. Some example embodiments are described with reference to FIGS. 1-4. In FIG. 1, a substrate is indicated generally with reference 10, and might comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 of FIG. 1 is diagrammatic only, and is depicted as comprising two different materials 12 and 14 over which silicon dioxide-comprising material will be deposited. Some embodiments do not require two different materials, and accordingly at least an outermost portion of substrate 10 might be encompassed by a single material. Materials 12 and 14 might differ in one or both of composition or density, by way of example. In one embodiment, one of the at least two different materials 12, 14 comprises at least one of silicon (i.e., doped or undoped monocrystalline or polycrystalline silicon), such silicon covered with a native oxide of no greater than 15 Angstroms thick, or silicon dioxide which is at least 20 Angstroms thick (i.e., a thermally grown silicon dioxide layer/region). Another of the at least two different materials 12 and 14 in one embodiment comprises silicon nitride.

Figure 2:
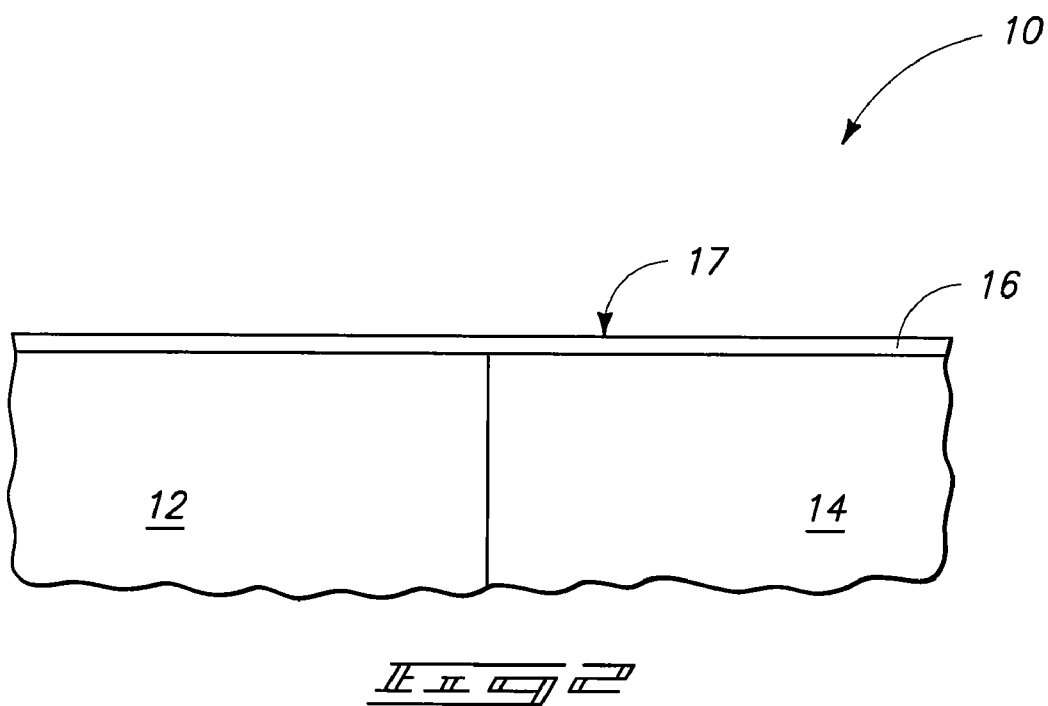
FIG. 2 is a view of the FIG. 1 substrate subsequent to that shown by FIG. 1.

Referring to FIG. 2, precursors comprising ozone and TEOS have been flowed to substrate 10 under conditions effective to deposit a silicon dioxide-comprising material 16 having an outer surface 17 onto substrate 10. In one embodiment, the conditions comprise subatmospheric pressure conditions. By way of example only, such deposit can occur by positioning substrate 10 within any suitable deposition chamber. In one embodiment, example conditions include from about 250° C. to about 650° C., with example pressure conditions being from about 5 Torr to about 600 Torr. Further by way of example only, TEOS can be provided to the substrate by a vaporizer held at 150° C. and mixing such with an inert helium carrier gas flow to establish a flow rate of TEOS and helium to the substrate at a rate of 200 milligrams per minute. Further by way of example only, ozone can be provided to the substrate from any suitable ozonator system, for example flowing $O_2$ and $N_2$ through an ozonator to yield an ozone stream of 12.8% atomic. Such flowing streams can be combined in a showerhead within the chamber or otherwise provided in combination or separately to a substrate, and are provided by way of example only. Regardless, $O_2$ may also of course flow to the substrate along with $O_3$. Further by way of example only (i.e., in a chamber capable of processing 300 mm substrates), combined $O_3$ and $O_2$ flow (about 12% to about 18% by weight $O_3$) may be at about 6,500 sccm to about 8,000 sccm, and TEOS flow may be at about 200 mg/min to about 1,500 mg/min (provided by He carrier flow of from about 6,500 sccm to about 10,000 sccm).

Silicon dioxide-comprising material 16 might comprise, consist essentially of, or consist of silicon dioxide. Regardless, such might deposit in an essentially non-selective manner over different materials 12 and 14 (as shown in FIG. 2), or might deposit in a selective manner over different materials 12 and 14 (not shown in FIG. 2). In the context of this document, "selective" means deposition of a stated material to a greater thickness over one material versus another material. Regardless, continuing deposition of silicon dioxide-comprising material 16 may or may not result in no selectivity in the deposit, selectivity in the deposit, or a change in degree of selectivity if selectivity in the deposit occurs at some point during the deposition of silicon dioxide-comprising material 16.

Figure 3:
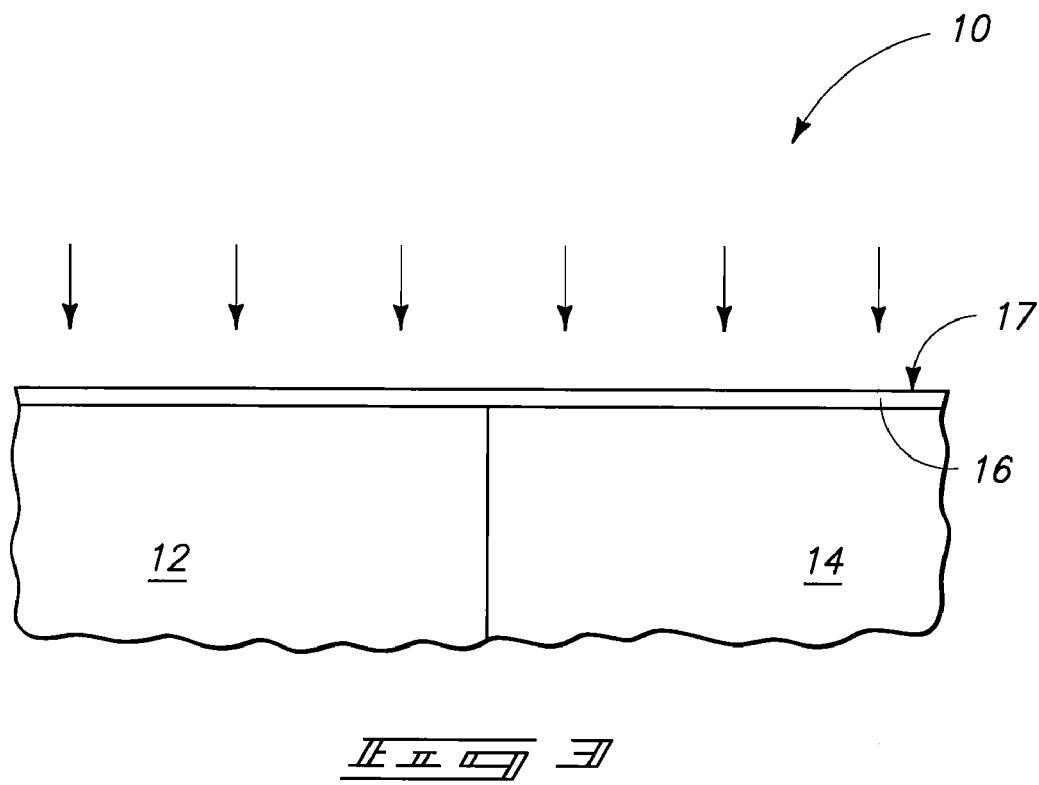
FIG. 3 is a view of the FIG. 1 substrate subsequent to that shown by FIG. 2.

Referring to FIG. 3, outer surface 17 is treated, which by way of example only in FIG. 3 is depicted with the downwardly directed arrows pointing toward surface 17. After the treating, as will be described in more detail below, precursors comprising ozone and TEOS are flowed to the substrate under conditions effective to deposit silicon dioxide-comprising material onto the treated outer surface of the substrate. Such subsequently deposited silicon dioxide-comprising material might be the same as or different in composition from silicon dioxide-comprising material 16. Further, the flowing precursors and the conditions before and after the treating might be the same, or alternately at least one of the flowing precursors and the conditions before and after the treating might be different. Accordingly by way of example only, temperature, pressure, precursor composition, and/or flow rates, etc. might be the same or different before and after the treating.

Regardless, in but one embodiment, the treating is effective to modify selectivity in the deposit of the silicon dioxide-comprising material after such treating relative to at least two different materials on the substrate than would otherwise occur under identical silicon dioxide-comprising material deposit conditions in the absence of such treating. In one embodiment, a theory by which such might occur is effectively carried out by acts upon outer surface 17. In other embodiments, treating occurs and is claimed independent of a specific act occurring relative to outer surface 17 as long as such results in a claimed effect independent of how such effect is achieved. Nevertheless, in further still other embodiments in the context of silicon dioxide deposition methods using at least ozone and TEOS as deposition precursors, certain materials are flowed to the substrate entirely independent of whether any effective "treating" occurs or independent of any resultant effect from such flowing or change in selectivity in silicon dioxide-comprising material deposit, as is clarified below.

In one embodiment, degree of hydroxyl (OH) presence at surface 17 may impact modification in selectivity as identified above. In one embodiment, treating of outer surface 17 is effective to one of add hydroxyl to or remove hydroxyl from outer surface 17 in comparison to any hydroxyl presence on outer surface 17 prior to such treating. Further and accordingly, hydroxyl may or may not be present prior to treating. Further and regardless in one embodiment, outer surface 17 might be treated effective to one of add hydroxyl to or remove hydroxyl from the outer surface in comparison to any hydroxyl presence on the outer surface prior to said treating independent of whether selectivity modification occurs in a subsequent deposit of silicon dioxide-comprising material over different materials 12 and 14 using ozone and TEOS.

By way of example, one embodiment of adding hydroxyl to outer surface 17 by such treating comprises exposing the outer surface to $H_2O$ vapor. Such might occur by flowing steam to the substrate, or for example by merely exposing surface 17 to air. For example and by way of example only, such exposure to air might be by ceasing flow of ozone and TEOS deposition precursors, and exposing surface 17 to air for some period of time, for example for at least five minutes, at least one hour, at least 24 hours, or perhaps for days. By way of example only, air exposure may be at room ambient at from 65° F. to 85° F., relative humidity from 30% to 50%, and ambient pressure from 0.9 atm to 1.1 atm. A steam exposure example might include a carrier gas flowed through a bubbler at a temperature of from 25° C. to 40° C., and substrate pressure at from 5 Torr to 600 Torr for from one to three minutes. Further by way of example only, the stated treating might occur within a chamber by flowing $H_2$ and $O_2$ to the chamber.

In one embodiment, outer surface 17 comprises hydroxyl prior to the treating, and the treating removes hydroxyl from such outer surface. In such instance, example treating comprises exposure to at least one of $O_2$, $O_3$, $H_2$, $N_2$, hexachlorodisilazane [$NH(SiCl_3)_2$], He, or Ar, including any mixtures thereof. Further by way of example only, such treating may be by exposure to $O_2$ and/or $O_2$ plasma at 350° C. to 500° C. at from 5 Torr to 600 Torr for from one to three minutes. Similar conditions might be utilized with respect to ozone alone or in combination with $O_2$ and any one or combination of $H_2$, $N_2$, hexachlorodisilazane, He, or Ar.

The treating might be conducted during/while flowing the precursors which form outer surface 17, or might comprise stopping flowing of such precursors which form outer surface 17 prior to conducting the treating.

The flowing of precursors comprising ozone and TEOS to produce material 16 comprising outer surface 17 would of course be conducted for some period of time prior to conducting the treating. For example, such flowing of precursors which forms outer surface 17 might be conducted for at least 200 seconds prior to such treating, and in other embodiments for at least 300 seconds, or for at least 400 seconds prior to the treating. Independent of time, or alternately considered, conducting the flowing of precursors which form silicon dioxide-comprising material having outer surface 17 might be conducted to form material 16 to be at least 250 Angstroms thick prior to such treating, alternately at least 300 Angstroms thick, or at least 400 Angstroms thick prior to such treating. Again, selectivity in the deposit of material 16 over substrate 10 may result in such deposition over materials 12 and 14 (not shown), or may result in a substantially uniform blanket deposition thickness thereover as is shown. By way of example only, one example deposition which produces essentially no selectivity in an ozone TEOS deposition over any of silicon, silicon having a native oxide of 10 Angstroms thereover, silicon nitride, and thermally grown oxide of varying thickness includes use of an Applied Materials Producer Reactor providing a substrate temperature of 440° C. and an internal chamber pressure of 600 Torr during deposition. A stream comprising 12.8% $O_3$ was generated by flowing $O_2$ and $N_2$ (0.05%) through an ozonator system to yield a total flow of 17,000 sccm. TEOS was delivered into the chamber through a liquid delivery system by injecting TEOS into a vaporizer held at 150° C. and mixing it with a He carrier gas to establish a flow rate of 200 milligrams per minute. The line temperature leading to the reactor was held constant at 110° C. Such resulted in essentially no selectivity for at least about 300 seconds, which produced a layer 16 of a thickness of about 250 Angstroms.

Figure 4:
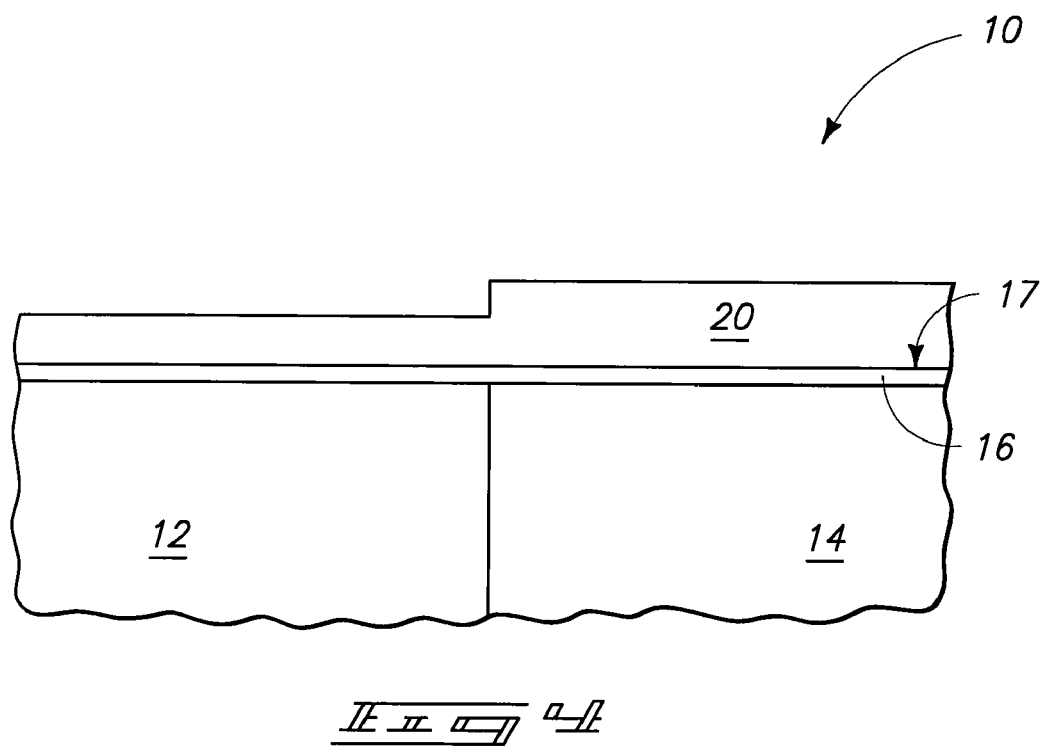
FIG. 4 is a view of the FIG. 1 substrate subsequent to that shown by FIG. 3.

Referring to FIG. 4, and after the treating of FIG. 3, precursors comprising ozone and TEOS have been flowed to substrate 10 under conditions, in one embodiment under subatmospheric pressure conditions, effective to deposit silicon dioxide-comprising material 20 onto treated outer surface 17 of substrate 10. Again, the flowing precursors and the conditions before and after the treating might be the same, or at least one of the flowing precursors and the conditions before and after the treating might be different. Further, silicon dioxide-comprising material 20 might be the same or different in one of composition or density as material 16, and might be of greater or lesser thickness than material 16. Further where different composition materials 12 and 14 are utilized, silicon dioxide-comprising material 20 might deposit over surface 17 in some embodiments in a non-selective manner (not shown) or in a selective manner relative to one of materials 12 and 14, with FIG. 4 by way of example only depicting greater deposition thickness of material 20 over material 14 than over material 12. Further in one embodiment, the treating is effective to modify selectivity in the deposit of silicon dioxide-comprising material 20 after the treating relative to at least two different materials 12 and 14 on substrate 10 than would otherwise occur under identical silicon dioxide-comprising material 20 deposit conditions in the absence of such treating. Accordingly, the treating in at least two example embodiments might increase or decrease the selectivity of silicon dioxide-comprising material 20 deposit over materials 12 and 14 in comparison to selectivity that would occur in the absence of such treating.

In one embodiment, the treating adds hydroxyl to outer surface 17, and more silicon dioxide-comprising material after such treating deposits over at least one of silicon, silicon covered with a native oxide no greater than 15 Angstroms thick, or silicon dioxide at least 20 Angstroms thick than deposits over silicon nitride than would otherwise occur under identical silicon dioxide-comprising material deposit conditions in the absence of such treating. In an alternate embodiment, the treating removes hydroxyl from the outer surface, and more silicon dioxide-comprising material after such treating deposits over the silicon nitride than deposits over any of silicon, silicon covered with a native oxide no greater than 15 Angstroms thick, or silicon dioxide at least 20 Angstroms thick than would otherwise occur under identical silicon dioxide-comprising material deposit conditions in the absence of such treating.

Additional embodiments are contemplated which may or may not achieve some or any of the above-stated results. In one embodiment, a silicon dioxide deposition method using at least ozone and TEOS as deposition precursors includes, for a first period of time, flowing precursors comprising ozone and TEOS to a substrate under conditions effective to deposit silicon dioxide-comprising material onto the substrate. After the first period of time, at least one of $H_2$, $N_2$, hexachlorodisilazane, He, or Ar, including any mixtures thereof, is flowed to the substrate along with flowing ozone and TEOS to the substrate for a second period of time. After such second period of time, precursors comprising ozone and TEOS are flowed to the substrate under conditions effective to deposit silicon dioxide-comprising material onto the substrate. The flowing precursors and the conditions before and after the second period of time might be the same or different, and the silicon dioxide-comprising material formed after the second period of time might be the same or different, as that formed during the first period of time. Further and by way of example only, the first period of time might be any of at least about 200 seconds, at least about 300 seconds, or at least about 400 seconds. Further by way of example only, the second period of time might be at least 60 seconds, and perhaps no more than 300 seconds.

In one embodiment, a silicon dioxide deposition method using at least ozone and TEOS as deposition precursors includes, for a first period of time, flowing precursors comprising $O_2$, $O_3$, and TEOS to a substrate under conditions effective to deposit silicon dioxide-comprising material onto the substrate. The substrate comprises two different materials over which said silicon dioxide-comprising material is deposited during such first period of time. After the first period of time, relative flow of at least one of $O_2$ or $O_3$ compared to TEOS flow to the substrate is increased for a second period of time. After such second period of time, precursors comprising $O_2$, $O_3$, and TEOS are flowed to the substrate under conditions effective to deposit silicon dioxide-comprising material onto the substrate. The increasing of relative flow of at least one of $O_2$ or $O_3$ compared to TEOS flow to the substrate for the second period of time is effective to modify selectivity in the deposit of the silicon dioxide-comprising material after said second period of time relative to the two different materials on the substrate than would otherwise occur under identical silicon dioxide-comprising material deposit conditions in the absence of such treating. Other processing attributes and results as described above may or may not be utilized or occur. Regardless, the increasing might comprise, in one embodiment, adding flow of at least $O_2$ or $O_3$ to the substrate, and independent of whether flow of TEOS remains constant during the first and second time periods. In one embodiment, the increasing comprises decreasing flow of TEOS to the substrate, and independent of whether flow of $O_2$ and $O_3$ remains constant during the first and second periods of time. In one embodiment, the increasing comprises adding flow of at least one of $O_2$ or $O_3$ to the substrate and decreasing flow of TEOS to the substrate.

In one embodiment, a silicon dioxide deposition method using at least ozone and TEOS as deposition precursors includes, for a first period of time, flowing precursors comprising $O_2$, $O_3$, and TEOS to a substrate under conditions effective to deposit silicon dioxide-comprising material onto the substrate. After the first period of time, TEOS flow to the substrate is stopped while continuing to flow $O_2$ and $O_3$ to the substrate for a second period of time. After such second period of time, precursors comprising $O_2$, $O_3$, and TEOS are flowed to the substrate under conditions effective to deposit silicon dioxide-comprising material onto the substrate. Any of the above stated attributes or results may be employed or result. Further by way of example only, flow of $O_2$ and $O_3$ might remain constant or vary during the first and second periods of time.

In one embodiment, a silicon dioxide deposition method using at least ozone and TEOS as deposition precursors includes, for a first period of time, flowing precursors comprising ozone and TEOS to a substrate under conditions effective to deposit silicon dioxide-comprising material having an outer surface onto the substrate. After the first period of time, the deposit of such silicon dioxide-comprising material is stopped. After stopping such deposit of silicon dioxide-comprising material, at least of one $O_2$, $O_3$, $H_2$, $N_2$, hexachlorodisilazane, He, or Ar, including any mixtures thereof, are flowed to the substrate. Thereafter, precursors comprising ozone and TEOS are flowed to the substrate under conditions effective to deposit silicon dioxide-comprising material over the outer surface of the substrate. Any of the above-described techniques or results may or may not occur.

Additional embodiments of the invention contemplate one or more additional treatings, flowings, increasings, and/or stoppings with additional depositing of silicon dioxide-comprising material. For example in one embodiment, the flowing precursors comprising ozone and TEOS after the treating forms the silicon dioxide-comprising material to comprise another outer surface. The another outer surface is treated effective to one of add hydroxyl to or remove hydroxyl from the another outer surface in comparison to any hydroxyl presence on the another outer surface prior to said treating. After the treating of the another outer surface, precursors comprising ozone and TEOS are flowed to the substrate under subatmospheric pressure conditions effective to deposit silicon dioxide-comprising material onto the treated another outer surface of the substrate. Any attribute as described above with respect to all of the example described embodiments might be utilized. In one embodiment, the treating of the another outer surface is the same as the first stated treating of the first stated outer surface. In one embodiment, the treating of the another outer surface is different from the first stated treating of the first stated outer surface (i.e., in treatment material and/or conditions). In one embodiment, the treating the another outer surface adds hydroxyl to the another outer surface. In one embodiment, the another outer surface comprises hydroxyl prior to the treating thereof, and the treating the another outer surface removes hydroxyl from the another outer surface. Further and regardless, the silicon dioxide-comprising material deposited after treating the another outer surface might be the same or different from that deposited after the first stated treating.

In one embodiment wherein at least one of $H_2$, $N_2$, hexachlorodisilazane, He, or Ar is flowed for the second period of time and precursors comprising ozone and TEOS are flowed thereafter, at least one of $H_2$, $N_2$, hexachlorodisilazane, He, or Ar, including any mixtures thereof, is thereafter flowed to the substrate along with flowing ozone and TEOS to the substrate for a third period of time. After the third period of time, precursors comprising ozone and TEOS are flowed to the substrate under conditions effective to deposit silicon dioxide-comprising material onto the substrate. The stated flowing during the third period of time may be the same as or different from in at least one of composition and conditions as the stated flowing during the second period of time. Further, the flowing of precursors comprising ozone and TEOS after the third period of time might be the same as or different from in at least one of composition and conditions as the stated flowing of precursors comprising ozone and TEOS after the second period of time, and regardless the silicon dioxide-comprising material deposited thereby might be the same or different.

In one embodiment wherein precursors comprising $O_2$, $O_3$, and TEOS have been flowed to the substrate after the second period of time where increasing occurred of relative flow of at least one of $O_2$ or $O_3$ compared to TEOS flow to the substrate for the second period of time, relative flow of at least one of $O_2$ or $O_3$ compared to TEOS flow to the substrate is then increased for a third period of time. After the third period of time, precursors comprising $O_2$, $O_3$, and TEOS are flowed to the substrate under conditions effective to deposit silicon dioxide-comprising material onto the substrate. The increasing relative flow of at least one of $O_2$ or $O_3$ compared to TEOS flow to the substrate for the third period of time is effective to modify selectivity in the deposit of the silicon dioxide-comprising material after the third period of time relative to the two different materials on the substrate than would otherwise occur under identical silicon dioxide-comprising material deposit conditions in the absence of said treating for the third period of time. The stated increasing during the third period of time may be the same as or different from the stated increasing during the second period of time. Further, the flowing of precursors comprising $O_2$, $O_3$, and TEOS after the third period of time might be the same as or different from in at least one of composition and conditions as the stated flowing of precursors comprising $O_2$, $O_3$, and TEOS after the second period of time, and regardless the silicon dioxide-comprising material deposited thereby might be the same or different.

In one embodiment wherein precursors comprising $O_2$, $O_3$, and TEOS are flowed after a second period of time that comprised stopping TEOS flow to the substrate while continuing to flow $O_2$ and $O_3$ to the substrate for such second period of time, TEOS flow is to the substrate is then stopped while continuing to flow $O_2$ and $O_3$ to the substrate for a third period of time. After the third period of time, precursors comprising $O_2$, $O_3$, and TEOS are flowed to the substrate under conditions effective to deposit silicon dioxide-comprising material onto the substrate. Conditions of the stated stopping during the third period of time may be the same as or different from conditions of the stated stopping during the second period of time. Further, the flowing of precursors comprising $O_2$, $O_3$, and TEOS after the third period of time might be the same as or different from in at least one of composition and conditions as the stated flowing of precursors comprising $O_2$, $O_3$, and TEOS after the second period of time, and regardless the silicon dioxide-comprising material deposited thereby might be the same or different.

In one embodiment wherein precursors comprising ozone and TEOS are flowed after treating the outer surface, such forms another outer surface which is then treated. After the treating of the another outer surface, precursors comprising ozone and TEOS are flowed to the substrate under conditions effective to deposit silicon dioxide-comprising material onto the treated another outer surface of the substrate. The treating the another outer surface is effective to modify selectivity in the deposit of the silicon dioxide-comprising material after said treating the another outer surface relative to at least two different materials on the substrate than would otherwise occur under identical silicon dioxide-comprising material deposit conditions in the absence of said treating the another outer surface. Treating of the another outer surface might be the same as or different from the treating of the first stated outer surface. Further and regardless, the silicon dioxide-comprising material deposited after treating the another outer surface might be the same or different from that deposited after the first stated treating.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A silicon dioxide deposition method using at least ozone and TEOS as deposition precursors, comprising:
    flowing precursors comprising ozone and TEOS to a substrate to deposit silicon dioxide-comprising material having an outer surface onto the substrate;
    providing the outer surface to comprise hydroxyl;
    treating the outer surface having hydroxyl to remove hydroxyl from the outer surface, the treating comprising exposure to at least one of $H_2$ or hexachlorodisilazane, including any mixture thereof; and
    after the treating, flowing precursors comprising ozone and TEOS to the substrate to deposit silicon dioxide-comprising material onto the treated outer surface of the substrate.

2. The method of claim 1 wherein the treating comprises exposure to $H_2$.

3. The method of claim 1 wherein the treating comprises exposure to hexachlorodisilazane.

4. The method of claim 1 wherein the treating comprises exposure to a mixture of $H_2$ and hexachlorodisilazane.

5. A silicon dioxide deposition method using at least ozone and TEOS as deposition precursors, comprising:
    flowing precursors comprising ozone and TEOS to a substrate to deposit silicon dioxide-comprising material having an outer surface onto the substrate;
    during said flowing precursors which forms said outer surface, treating the outer surface to one of add hydroxyl to or remove hydroxyl from the outer surface in comparison to any hydroxyl presence on the outer surface prior to said treating; and
    after the treating, flowing precursors comprising ozone and TEOS to the substrate to deposit silicon dioxide-comprising material onto the treated outer surface of the substrate.

6. The method of claim 5 wherein the treating adds hydroxyl to the outer surface.

7. The method of claim 5 wherein the outer surface comprises hydroxyl prior to the treating, the treating removing hydroxyl from the outer surface.

8. A silicon dioxide deposition method using at least ozone and TEOS as deposition precursors, comprising:
    flowing precursors comprising ozone and TEOS to a substrate to deposit silicon dioxide-comprising material having an outer surface onto the substrate;
    providing the outer surface to comprise hydroxyl;
    treating the outer surface having hydroxyl to remove hydroxyl from the outer surface, the treating modifying selectivity in the deposit of the silicon dioxide-comprising material after said treating relative to at least two different materials on the substrate than would otherwise occur under identical silicon dioxide-comprising material deposit conditions in the absence of said treating;

after the treating, flowing precursors comprising ozone and TEOS to the substrate to deposit silicon dioxide-comprising material onto the treated outer surface of the substrate;
one of the at least two different materials comprises at least one of silicon, silicon covered with a native oxide no greater than 15 Angstroms thick, or silicon dioxide at least 20 Angstroms thick and another of the at least two different materials comprises silicon nitride; and
more silicon dioxide-comprising material after said treating deposits over the silicon nitride than deposits over the at least one of silicon, silicon covered with a native oxide no greater than 15 Angstroms thick, or silicon dioxide at least 20 Angstroms thick than would otherwise occur under identical silicon dioxide-comprising material deposit conditions in the absence of said treating.

9. The method of claim 8 wherein the one of the at least two different materials comprises exposed silicon.

10. The method of claim 8 wherein the one of the at least two different materials comprises silicon covered with a native oxide no greater than 15 Angstroms thick.

11. The method of claim 8 wherein the one of the at least two different materials comprises silicon dioxide at least 20 Angstroms thick.

12. The method of claim 8 wherein the flowing of precursors comprising ozone and TEOS to the substrate before and after the treating is under subatmospheric pressure conditions.

13. A silicon dioxide deposition method using at least ozone and TEOS as deposition precursors, comprising:
flowing precursors comprising ozone and TEOS to a substrate to deposit silicon dioxide-comprising material having an outer surface onto the substrate;
during said flowing precursors which forms said outer surface, treating the outer surface to one of add hydroxyl to or remove hydroxyl from the outer surface in comparison to any hydroxyl presence on the outer surface prior to said treating; and
after the treating, flowing precursors comprising ozone and TEOS to the substrate to deposit silicon dioxide-comprising material onto the treated outer surface of the substrate, the flowing precursors comprising ozone and TEOS after the treating forming the silicon dioxide-comprising material to comprise another outer surface, and comprising:
treating the another outer surface to one of add hydroxyl to or remove hydroxyl from the another outer surface in comparison to any hydroxyl presence on the another outer surface prior to said treating; and
after the treating of the another outer surface, flowing precursors comprising ozone and TEOS to the substrate to deposit silicon dioxide-comprising material onto the treated another outer surface of the substrate.

14. The method of claim 13 wherein the treating the another outer surface is the same as said treating the outer surface.

15. The method of claim 13 wherein the treating the another outer surface is different from said treating the outer surface.

16. The method of claim 13 wherein the treating the another outer surface adds hydroxyl to the outer surface.

17. The method of claim 13 wherein the another outer surface comprises hydroxyl prior to the treating thereof, the treating of the another outer surface removing hydroxyl from the another outer surface.

18. The method of claim 13 wherein the flowing of precursors comprising ozone and TEOS to the substrate before and after the treating is under subatmospheric pressure conditions.

19. A silicon dioxide deposition method using at least ozone and TEOS as deposition precursors, comprising:
for a first period of time, flowing precursors comprising ozone and TEOS to a substrate under conditions which deposit silicon dioxide-comprising material onto the substrate;
after the first period of time, flowing at least one of $H_2$, $N_2$, hexachlorodisilazane, He, or Ar, including any mixtures thereof, to the substrate along with flowing ozone and TEOS to the substrate for a second period of time; and
after the second period of time, flowing precursors comprising ozone and TEOS to the substrate under conditions which deposit silicon dioxide-comprising material onto the substrate.

20. The method of claim 19 wherein the flowing at least one of $H_2$, $N_2$, hexachlorodisilazane, He, or Ar, including any mixtures thereof, to the substrate along with flowing ozone and TEOS to the substrate for the second period of time comprises flowing $H_2$.

21. The method of claim 19 wherein the flowing at least one of $H_2$, $N_2$, hexachlorodisilazane, He, or Ar, including any mixtures thereof, to the substrate along with flowing ozone and TEOS to the substrate for the second period of time comprises flowing $N_2$.

22. The method of claim 19 wherein the flowing at least one of $H_2$, $N_2$, hexachlorodisilazane, He, or Ar, including any mixtures thereof, to the substrate along with flowing ozone and TEOS to the substrate for the second period of time comprises flowing hexachlorodisilazane.

23. The method of claim 19 wherein the flowing at least one of $H_2$, $N_2$, hexachlorodisilazane, He, or Ar, including any mixtures thereof, to the substrate along with flowing ozone and TEOS to the substrate for the second period of time comprises flowing at least one of He or Ar.

24. A silicon dioxide deposition method using at least ozone and TEOS as deposition precursors, comprising:
for a first period of time, flowing precursors comprising $O_2$, $O_3$, and TEOS to a substrate under conditions which deposit silicon dioxide-comprising material onto the substrate, the substrate comprising two different materials over which said silicon dioxide-comprising material is deposited during said first period of time;
after the first period of time, increasing relative flow of at least one of $O_2$ or $O_3$ compared to TEOS flow to the substrate for a second period of time; and
after the second period of time, flowing precursors comprising $O_2$, $O_3$, and TEOS to the substrate under conditions which deposit silicon dioxide-comprising material onto the substrate, said increasing relative flow of at least one of $O_2$ or $O_3$ compared to TEOS flow to the substrate for the second period of time modifying selectivity in the deposit of the silicon dioxide-comprising material after said second period of time relative to the two different materials on the substrate than would otherwise occur under identical silicon dioxide-comprising material deposit conditions in the absence of said treating.

25. The method of claim 24 wherein the increasing of relative flow comprises increasing relative flow of $O_2$.

26. The method of claim 24 wherein the increasing of relative flow comprises increasing relative flow of $O_3$.

27. A silicon dioxide deposition method using at least ozone and TEOS as deposition precursors, comprising:

for a first period of time, flowing precursors comprising ozone and TEOS to a substrate under conditions which deposit silicon dioxide-comprising material having an outer surface onto the substrate;

after the first period of time, stopping the deposit of silicon dioxide-comprising material;

after said stopping, flowing at least one of $H_2$ or hexachlorodisilazane, including any mixture thereof, to the substrate; and after flowing the at least one of $H_2$ or hexachlorodisilazane, including any mixture thereof, to the substrate, flowing precursors comprising ozone and TEOS to the substrate under conditions which deposit silicon dioxide-comprising material over the outer surface of the substrate.

28. The method of claim 27 wherein the flowing at least one of $H_2$ or hexachlorodisilazane treating comprises flowing $H_2$.

29. The method of claim 27 wherein the flowing at least one of $H_2$ or hexachlorodisilazane treating comprises flowing hexachlorodisilazane.

30. The method of claim 27 wherein the flowing at least one of $H_2$ or hexachlorodisilazane treating comprises flowing a mixture of $H_2$ and hexachlorodisilazane.

* * * * *